US008062553B2

(12) United States Patent
Hsu et al.

(10) Patent No.: US 8,062,553 B2
(45) Date of Patent: *Nov. 22, 2011

(54) COMPOSITIONS OF POLYANILINE MADE WITH PERFUOROPOLYMERIC ACID WHICH ARE HEAT-ENHANCED AND ELECTRONIC DEVICES MADE THEREWITH

(75) Inventors: Che-Hsiung Hsu, Wilmington, DE (US); Hjalti Skulason, Buellton, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 352 days.

This patent is subject to a terminal disclaimer.

(21) Appl. No.: 11/960,790

(22) Filed: Dec. 20, 2007

(65) Prior Publication Data
US 2008/0210909 A1 Sep. 4, 2008

Related U.S. Application Data

(60) Provisional application No. 60/877,694, filed on Dec. 28, 2006.

(51) Int. Cl.
*H01B 1/12* (2006.01)
(52) U.S. Cl. .......... 252/500; 528/210; 528/422
(58) Field of Classification Search .......... 252/500; 528/210, 422
See application file for complete search history.

(56) References Cited

U.S. PATENT DOCUMENTS

| | | | |
|---|---|---|---|
| 3,282,875 A | 11/1966 | James | |
| 4,358,545 A | 11/1982 | Ezzell et al. | |
| 4,433,082 A | 2/1984 | Grot | |
| 4,552,927 A | 11/1985 | Warren | |
| 4,731,408 A | 3/1988 | Jasne | |
| 4,869,979 A | 9/1989 | Ohtani et al. | |
| 4,889,659 A | 12/1989 | Genies | |
| 4,933,106 A | 6/1990 | Sakai et al. | |
| 4,940,525 A | 7/1990 | Ezzell | |
| 4,959,430 A | 9/1990 | Jonas et al. | |
| 4,973,391 A | 11/1990 | Madou et al. | |
| 5,002,700 A | 3/1991 | Otagawa et al. | |
| 5,035,926 A | 7/1991 | Jonas et al. | |
| 5,185,100 A | 2/1993 | Han et al. | |
| 5,247,190 A | 9/1993 | Friend et al. | |
| 5,286,413 A | 2/1994 | Hannecart | |
| 5,294,504 A | 3/1994 | Otagawa et al. | |
| 5,300,575 A | 4/1994 | Jonas | |
| 5,312,681 A | 5/1994 | Muys | |
| 5,317,169 A | 5/1994 | Nakano et al. | |
| 5,354,613 A | 10/1994 | Quintens et al. | |
| 5,370,981 A | 12/1994 | Krafft et al. | |
| 5,372,924 A | 12/1994 | Quintens et al. | |
| 5,378,402 A | 1/1995 | Cross et al. | |
| 5,489,400 A | 2/1996 | Liu et al. | |
| 5,567,356 A | 10/1996 | Kinlen | |
| 5,578,249 A | 11/1996 | Ohtani et al. | |
| 5,585,038 A * | 12/1996 | Kirmanen et al. ......... 252/500 | |
| 5,705,888 A | 1/1998 | Staring et al. | |
| 5,716,550 A | 2/1998 | Gardner et al. | |
| 5,766,515 A | 6/1998 | Jonas et al. | |
| 5,863,465 A | 1/1999 | Kinlen | |
| 5,910,385 A | 6/1999 | Gardner et al. | |
| 5,917,279 A | 6/1999 | Elschner et al. | |
| 5,986,400 A | 11/1999 | Staring et al. | |
| 5,994,496 A | 11/1999 | Van Haare et al. | |
| 6,004,483 A | 12/1999 | Jonas et al. | |
| 6,083,635 A | 7/2000 | Jonas et al. | |
| 6,150,426 A | 11/2000 | Curtin et al. | |
| 6,197,418 B1 | 3/2001 | Cloots et al. | |
| 6,225,040 B1 | 5/2001 | Muys et al. | |
| 6,303,943 B1 | 10/2001 | Yu et al. | |
| 6,340,496 B1 | 1/2002 | Cloots et al. | |
| 6,358,437 B1 | 3/2002 | Jonas | |
| 6,376,105 B1 | 4/2002 | Jonas et al. | |
| 6,391,481 B1 | 5/2002 | Jonas et al. | |
| 6,452,711 B1 | 9/2002 | Heuer | |
| 6,515,314 B1 | 2/2003 | Duggal et al. | |
| 6,611,096 B1 | 8/2003 | McCormick et al. | |
| 6,632,472 B2 | 10/2003 | Louwet | |
| 6,756,474 B2 | 6/2004 | Hsu | |
| 7,071,289 B2 | 7/2006 | Sotzing | |
| 7,166,010 B2 | 1/2007 | Lamansky et al. | |
| 7,317,047 B2 | 1/2008 | Hsu | |
| 7,351,358 B2 | 4/2008 | Hsu et al. | |
| 7,371,336 B2 * | 5/2008 | Hsu et al. ................ | 252/301.35 |
| 7,390,438 B2 | 6/2008 | Hsu et al. | |
| 7,431,866 B2 | 10/2008 | Hsu et al. | |
| 7,462,298 B2 * | 12/2008 | Hsu et al. ................ | 252/301.35 |
| 2001/0019782 A1 | 9/2001 | Igarashi et al. | |
| 2002/0038999 A1 | 4/2002 | Cao | |

(Continued)

FOREIGN PATENT DOCUMENTS
CN 1274869 A 11/2000
(Continued)

OTHER PUBLICATIONS

Hsu et al "Novel Preparation and Properties of Conductive Polyaniline/Nafion Film", Synthetic Metals 41-43 (1991) 671-674.*
Angelopoulos et al. Mol. Cryst. Liqu. Cryst., 1988, vol. 160, p. 151-163.
Barthet et al, "Mixed electronic and ionic conductors: a new route to Nafion-doped polyaniline" in Journal of Electroanalytical Chemistry, vol. 388, pp. 35-44, 1995.
Barthet et al. "Aspects of the Conducting Properties of Nation Doped Polyaniline", Electrochimica Acta, 1996, vol. 41, No. 18, pp. 2791-2798.
Baytron Coating Guide Issue Oct. 2002—Obtained From www.HCSTARCK-echemicals.com.
Colvin et al—Light-Emitting Diodes Made From Cadmium Selenide Nanocrystals and a Semiconducting Polymer, Nature, 1994, vol. 370 pp. 354-357.

(Continued)

Primary Examiner — Mark Kopec

(57) ABSTRACT

Electrically conductive dispersions of high pH polyaniline/perfluorosulfonic acid or perfluoroalkylene sulfonamide polymers are provided. Also provided are films made with such dispersions having enhanced electrical conductivity. Devices are provided with at least one layer comprised of a film that is baked at a temperature above 100° C. Further provided are processes for making films and layers for devices comprising such films.

1 Claim, No Drawings

U.S. PATENT DOCUMENTS

| | | |
|---|---|---|
| 2002/0041151 A1 | 4/2002 | Park |
| 2002/0098377 A1 | 7/2002 | Cao et al. |
| 2002/0127381 A1 | 9/2002 | Will et al. |
| 2002/0136923 A1 | 9/2002 | Jonas et al. |
| 2004/0010115 A1 | 1/2004 | Sotzing |
| 2004/0072987 A1 | 4/2004 | Groenendaal et al. |
| 2004/0092700 A1 | 5/2004 | Hsu |
| 2004/0102577 A1 | 5/2004 | Hsu et al. |
| 2004/0124504 A1 | 7/2004 | Hsu |
| 2004/0127637 A1 | 7/2004 | Hsu et al. |
| 2004/0181011 A1 | 9/2004 | Korzhenko et al. |
| 2004/0222413 A1 | 11/2004 | Hsu et al. |
| 2004/0254297 A1 | 12/2004 | Hsu et al. |
| 2004/0262599 A1 | 12/2004 | Bernds |
| 2005/0222333 A1* | 10/2005 | Hsu .......................... 525/178 |
| 2008/0210910 A1* | 9/2008 | Hsu et al. ................ 252/500 |

FOREIGN PATENT DOCUMENTS

| | | |
|---|---|---|
| CN | 1276388 A | 12/2000 |
| DE | 2029556 A1 | 12/1971 |
| DE | 3938094 A1 | 5/1991 |
| DE | 4211459 A1 | 10/1993 |
| DE | 4334390 A1 | 4/1995 |
| EP | 560721 A2 | 9/1993 |
| EP | 440957 A2 | 3/1996 |
| EP | 488321 A1 | 10/1997 |
| EP | 593111 A1 | 6/1998 |
| EP | 1079397 A1 | 2/2001 |
| EP | 1227529 A2 | 7/2002 |
| EP | 1231251 A1 | 8/2002 |
| EP | 1054414 A1 | 3/2003 |
| EP | 1061530 A1 | 3/2003 |
| EP | 962943 A1 | 12/2003 |
| EP | 1384739 A1 | 1/2004 |
| EP | 1026152 B1 | 7/2006 |
| EP | 1191614 B1 | 5/2009 |
| EP | 1191612 B1 | 9/2009 |
| FR | 2632979 A1 | 12/1989 |
| GB | 2124635 A | 2/1984 |
| JP | 62138582 A | 6/1987 |
| JP | 62164717 A | 7/1987 |
| JP | 63135453 A | 6/1988 |
| JP | 63215772 A | 9/1988 |
| JP | 02160823 A | 6/1990 |
| JP | 02209931 A | 8/1990 |
| JP | 04234453 A | 8/1992 |
| JP | 05255576 A | 10/1993 |
| JP | 06264024 A | 9/1994 |
| JP | 06306280 A | 11/1994 |
| JP | 06313038 A | 11/1994 |
| JP | 07010973 A | 1/1995 |
| JP | 07090060 A | 4/1995 |
| JP | 07165892 A | 6/1995 |
| JP | 08048858 A | 2/1996 |
| JP | 09176310 A | 7/1997 |
| JP | 10261418 A | 9/1998 |
| JP | 10509751 A | 9/1998 |
| JP | 11353934 A | 12/1999 |
| JP | 2000091081 A | 3/2000 |
| JP | 2000505249 A | 4/2000 |
| JP | 2000336154 A | 12/2000 |
| JP | 2001035276 A | 2/2001 |
| JP | 2001270999 A | 10/2001 |
| JP | 2001325831 A | 11/2001 |
| JP | 2002500408 A | 1/2002 |
| JP | 2002246177 A | 8/2002 |
| JP | 2003261749 A | 9/2003 |
| JP | 2003297582 A | 10/2003 |
| JP | 2003301116 A | 10/2003 |
| JP | 2004502004 T | 1/2004 |
| JP | 2004107552 A | 4/2004 |
| JP | 2004231939 A | 8/2004 |
| JP | 2004523623 T | 8/2004 |
| JP | 2004532307 T | 10/2004 |
| JP | 2005108504 A | 4/2005 |
| JP | 2005120363 A | 5/2005 |
| JP | 2005536595 T | 12/2005 |
| JP | 2006500461 T | 1/2006 |
| JP | 2006500463 T | 1/2006 |
| JP | 2006502254 T | 1/2006 |
| JP | 2009270117 A | 11/2009 |
| RU | 2035803 C1 | 5/1995 |
| WO | 9934371 A1 | 7/1999 |
| WO | 0138219 A1 | 5/2001 |
| WO | 0199207 A2 | 12/2001 |
| WO | 0202714 A2 | 1/2002 |
| WO | 0215645 A1 | 2/2002 |
| WO | 02065484 A1 | 8/2002 |
| WO | 02080627 A2 | 10/2002 |
| WO | 2002079316 A2 | 10/2002 |
| WO | 02099907 A1 | 12/2002 |
| WO | 03006537 A1 | 1/2003 |
| WO | 03012908 A2 | 2/2003 |
| WO | 03048228 A1 | 6/2003 |
| WO | 03050824 A1 | 6/2003 |
| WO | 03074601 A2 | 9/2003 |
| WO | 2004018544 A1 | 3/2004 |
| WO | 2004020444 A1 | 3/2004 |
| WO | 2004029133 A1 | 4/2004 |
| WO | 2004029176 A1 | 4/2004 |
| WO | 2004094501 A2 | 11/2004 |
| WO | 2004106404 A1 | 12/2004 |

OTHER PUBLICATIONS

Conductive Polymer From Wikipedia, The Free Encyclopedia.

Database CA [Online] Chemical Abstracts Service, Columbus, Ohio, US; Takei, Masashi et al: Metal colloid solution, electric conductor ink, electric conductor coating, and undercoating film for forming electric conductor coating layer, retrieved from STN Database accession No. 2001:847689.

Database CA [Online] Chemical Abstracts Service, Columbus, Ohio, US; Wakita, Katsuya et al: "High performance odor sensors and mthod for their manufacture," retrieved from STN Database accession No. 2002:219874.

Gao, J. et al., Soluble polypyrrole as the transparent anode in polymer light-emitting diodes, Synthetic Metals, 1996, 221-223, 82, Elsevier Science S.A.

Hong et al, "Association of Nafion with Polypyrrole Nanoparticles in a Hydrophilic Polymer Network: Effects on Proton Transport," Journal of Colloid and Interface Science, vol. 218 pp. 233-242; 19991001.

Lefebvre, Mark et al., Chemical Synthesis, Characterization, and Electrochemical Studies of Poly(3,4-ethylenedioxythiophene)/Poly-(styrene-4-sulfonate) Composites, Chem. Mater., 1999, 262-268, 11, American Chemical Society.

Levi et al—Polymer and Cathode Emission Studies of Polymer-Based Light-Emitting Diodes Under Strong Electrial Pulse Excitation, Journal of Applied Physics, 2000 vol. 88 No. 5 pp. 2548-2552.

Lim et al—Degradation of Organic Light-Emitting Devices Due to Formation and Growth of Dark Spots, Materials Science and Engineering 2001, pp. 154-159.

Nafion Definition; Wikipedia; 20100218.

Pickup, Peter G. et al., Electronically conducting cation-exchange polymer powders: synthesis, characterization and applications in PEM fuel cells and supercapacitors, Journal of New Materials for Electrochemical Systems, 2000, 21-26, 3.

Qi, Zhigang et al., Size Control of Polypyrrole Particles, Chem. Mater., 1997, 2394-2939, 9, American Chemical Society.

Römpp Chemistry Dictionary, 9th Edition, 1993 (Machine Translation also submitted).

Schroedner et al—Organische Feldeffekttransistoren Auf Basis Halbleitender Polymere/Organic Field-Effect Transistors Based on Semiconducting Polymers. Elektrotechnik und Informationstechnik, Springer Verlag. 2003 vol. 120 No. 6, pp. 205-209 (Machine Translation also submitted).

Sharpe et al—Improved Cationic Conductive Polymer, Calgon Corp, Coating Conference (Proceeding) 1981 pp. 83-87.

Simpson et al.—Advances and Applications of Inherently Conductive Polymer Technologies Based on Poly(3,4-Ethylenedioxythiophene) 2005 AIMCAL Fall Technical Conference.

Sun, Zaicheng et al, Catalytic Oxidation Polymerization of Aniline in an H2O2-Fe2+ System, Journal Applied Polymer Science, vol. 72, pp. 1077-1084, 19990000.

Thelakkat et al—Poly(Triarylamine)S-Synthesis and Application in Electroluminescent Devices and Photovoltaics, Synthetic Metals, 1999, vol. 102 pp. 1125-1128.

Extended European Search Report for Application No. EP10 01 2649; Rafael Kiebooms, Mar. 1, 2011.

Extended European Search Report for Application No. EP 10 01 1570; Christian Meiners Examiner, May 17, 2011.

Official Action of the European Patent Office; Feb. 25, 2010.

PCT International Search Report for PCT/US2003/030512; R. Kiebooms Authorized Officer, Feb. 19, 2004.

PCT International Search Report for PCT/US2005/008563; R. Kiebooms Authorized Officer; Jun. 17, 2005.

PCT International Search Report for International Application No. PCT/US2005/010853; D. Marsitzky Authorized Officer Sep. 26, 2005.

Baytron P Vap Al 4083 and Baytron P VP Ch 8000 Product Information for Electronic Grades Designed for Use As Hole-Injection Material in Oleds—Obtained From www.HCSTARCK-echemicals.com.

Baytron Product info from baytron.com; 20070801.

* cited by examiner

COMPOSITIONS OF POLYANILINE MADE WITH PERFUOROPOLYMERIC ACID WHICH ARE HEAT-ENHANCED AND ELECTRONIC DEVICES MADE THEREWITH

RELATED APPLICATION DATA

This application claims priority under 35 U.S.C. 119(e) from U.S. Provisional Application No. 60/877,694 filed on Dec. 28, 2006, which is incorporated by reference herein in its entirety.

FIELD OF THE DISCLOSURE

This disclosure relates to alkylammonium and alkali cation compositions of electrically conducting polyaniline made with a perfluoropolymeric acid. The disclosure also relates to a range of specifications of the electrically conducting polymers and applications thereof.

BACKGROUND

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer, or may be characterized as part of a bilayer anode. Typical conducting polymers employed as buffer layers include polyaniline and polydioxythiophenes such as poly(3,4-ethylenedioxythiophene) (PEDT).

There are provided herein needed film forming polymers at pH ranges sufficient to avoid device degradation but which are also useful in semiconducting device layers.

SUMMARY

There is provided:

An aqueous dispersion of polyaniline and at least one fluorinated polymeric acid selected from perfluorosulfonic acids and perfluoroalkylenesulfonimides.

In an embodiment, the perfluorosulfonic acids comprise perfluoro-olefins containing perfluorosulfonic acid side chains.

The dispersion may also comprise a cation composition. In some embodiments, the cation composition may be selected from ammonium, ammoniumalkyl, and alkali metal base water solutions.

The aqueous solutions may form films that are electrically conductive.

The films in some embodiments have a pH greater than 2.0, and in other embodiments, a pH greater than 4.0.

The films' electrically conductive properties may be enhanced by heat treatment. In some embodiments, the films are heat treated at a temperature above 100° C.

Also provided are devices comprising a film comprising an aqueous dispersion as disclosed above, and in some embodiments are provided devices including layers comprising such films.

DISCLOSURE

This disclosure relates to enhanced electrical conductivity of heat-treated films cast from high pH aqueous conducting polyaniline dispersions. The polyaniline is made from polymerization of aniline in the presence of a perfluoropolymericsulfonic acid or a perfluoroalkylenesulfonimide. The conducting polyaniline films are baked at temperatures above 100° C. in either air or nitrogen. High pH is obtained from adding ammonium, ammoniumalkyl, or alkali metal base water solution to the conducting polyaniline dispersion to greater than pH 2, preferably than pH 4. Concentration of the cation for forming salt with available acid is in the range of $1 \times 10^{-4}$ mole to $2 \times 10^{-3}$ mole per one-gram conducting polyaniline polymer.

The perfluoropolymeric acid comprises, but is not limited to, perfluoro-olefins which contain perfluorosulfonic acid side chains and perfluoroalkylenesulfonimides. The acids can be either water soluble or exist as colloids.

PKa of the perfluoropolymeric acids in water is preferably less than $-5$.

The electrically conducting polyanilines are made with perfluoropolymeric acid/aniline in molar ratio of 0.3 to 10, preferably 1 to 5, co-acid/monomer in molar ratio of 0.05 to 4, and solid weight % between 0.5 to 12, preferably between 2 to 8. The co-acid is preferably HCl.

OLEDs are typified in the following configuration: ITO (anode)/buffer layer/HTL(hole-transporting layer, optional)/EML(electroluminescence layer)/EIL(electron-injection layer)/cathode. Other optional layers may be included. The electrically conducting polyanilines are used as hole injection layers to improve electrical conductivity of the layer and lifetime of OLEDs.

Polyaniline emeraldine base contains a quinoid ring in every four aniline rings in polymer chain backbones. It is partially oxidized, but electrically non-conductive. The emeraldine base can be doped into electrically conductive emeraldine salt by protonic acids [Mol. Cryst. Liqu. Cryst., 151, 160 (1988)], which protonates imine nitrogen. It has been long established that every two aniline rings requires one protonic acid for forming acid/base salt.

EXAMPLES

Example 1

This example illustrates synthesis of polyaniline (PAni)/Nafion®, a poly(tetrafluoroethylene)/perfluoroethersulfonic acid, and ammonium cation composition of a high pH PAni/Nafion®.

A PAni/Nafion® dispersion used in this example was prepared using an aqueous Nafion® colloidal dispersion having an EW (acid equivalent weight) of 1000. The Nafion® dispersion at 25% (w/w) was made using a procedure similar to the procedure in U.S. Pat. No. 6,150,426, Example 1, Part 2, except that the temperature was approximately 270° C. and was then diluted with water to form a 12.0% (w/w) dispersion for the polymerization.

Aniline monomer was polymerized in the presence of the Nafion® dispersion as described in published U.S. Patent Application 2004-0127637. The reaction was quenched after about 20 hrs, 90 g of each Dowex™ M31, and Dowex™ M43 ion exchange resins, and 10 g n-propanol (30% v/v)/water were added to the reaction mixture and stirring it further overnight at 120 RPM. Both resins are from Dow Chemicals company (Midland, Mich., USA). The ion-exchange resins were finally filtered from the suspension through VWR 417 filter paper. The entire filtered dispersion was then pumped through an orifice of a Microfluidizer Processor M-110Y (Microfluidics, Massachusetts, USA) in one pass at 5,000 psi. pH of the dispersion was about 2. 160 g of the dispersion was added with ammonium hydroxide solution to adjust pH to 5.0.

The pH 5 dispersion was green in color and was measured to contain 6.2% PAni/Nafion® polymer. UV/V is spectrum of a solid film cast from the dispersion and subsequently dried at 50° C. shows an absorption peak at 764 nm in spite of the high pH. The distinct absorption peak reveals that the polyaniline is emeraldine salt, which is electrically conductive. The emeraldine polaniline salt is a well-known structure, where every two anilines requires one sulfonic acid of Nafion® for forming the emeraldine salt. Ion chromatography analysis of the pH 5.0 dispersion shows that it contains $797.3 \times 10^{-6}$ g $NH_4^+$, $16.5 \times 10^{-6}$ g chloride, $40.3 \times 10^{-6}$ g sulfate in one gram dispersion. The ion concentration is approximately equivalent to $44.2 \times 10^{-6}$ mole $NH_4^+$, $0.5 \times 10^{-6}$ mole chloride, and $0.4 \times 10^{-6}$ mole sulfate, respectively, per one gram of the dispersion. The charge balance of the three ions leaves $43 \times 10^{-6}$ mole $NH_4^+$ available for association with sulfonic acid of Nafion®. Based on the solid %, mole ratio of Nafion® with respect to aniline used in the polymerization, the dispersion contains about $58 \times 10^{-6}$ mole sulfonic acid group and $48 \times 10^{-6}$ mole aniline per one-gram dispersion. The amount aniline takes up 24 mmole sulfonic acid per one-gram dispersion to form emeradine ammonium salt. Remaining free sulfonic acid in the Nafion® is about 34 mmole, which is less than $NH_4^+$ in the dispersion. In spite of the excessive amount of $NH_4^+$, the emeraldine base of the polymer film remains doped to show the distinct absorption of emeraldine salt. $43 \times 10^{-6}$ mole $NH_4^+$ per one gram of the dispersion is equivalent to $6.9 \times 10^{-4}$ mole $NH_4^+$ per one-gram PAni/Nafion®.

Example 2

This example illustrates the effect of ammonium cation concentration and heat treatment in nitrogen atmosphere on conductivity of PAni/Nafion®.

A new batch of PAni/Nafion® dispersion synthesized according to the procedure and recipe described in Example 1. The dispersion was also resin-treated and microfluidized. Before addition of an aqueous ammonium hydroxide solution, pH of the dispersion was also 2.0 as illustrated in Example 1. The dispersion, green in color as expected for emeraldine polyaniline salt structure, was measured to contain 5.87% solid. Ion chromatography analysis shows that the dispersion contains $107.9 \times 10^{-6}$ g $NH_4^+$ per one gram of the dispersion. It also contains $107.0 \times 10^{-6}$ g chloride and $43.0 \times 10^{-6}$ g sulfate per one-gram dispersion. The ion concentration is approximately equivalent to $6.0 \times 10^{-6}$ mole $NH_4^+$, $3.1 \times 10^{-6}$ mole chloride, and $0.5 \times 10^{-6}$ mole sulfate per one gram of the dispersion, respectively. Charge balance of the three ions leaves $2.0 \times 10^{-6}$ mole $NH_4^+$ available for association with sulfonic acid of Nafion®. Based on the solid %, and mole ratio of Nafion® with respect to aniline used in the polymerization, the dispersion contains about $55 \times 10^{-6}$ mole sulfonic acid group and $45.8 \times 10^{-6}$ mole aniline per one gram of the dispersion. The amount aniline takes up $23 \times 10^{-6}$ mole sulfonic acid per one-gram dispersion for forming emeraldine ammonium salt. Remaining free sulfonic acid in the Nafion® is about $32 \times 10^{-6}$ mole, which is much higher than that of available $NH_4^+$ ($2.0 \times 10^{-6}$ mole), which is expected because of low pH of the dispersion. $2.0 \times 10^{-6}$ mole $NH_4^+$ per one-gram dispersion is equivalent to $0.34 \times 10^{-4}$ mole $NH_4^+$ per one gram of PAni/Nafion®.

A portion of pH 2.0 dispersion was added with ammonium hydroxide to increase the pH to 5.0. The dispersion is still green in color. The pH 2.0 and pH 5.0 PAni/Nafion® dispersions were spin-coated separately on resistance measurement substrates. Each substrate contains parallel ITO lines as electrodes. They were then baked at either 130° C. or 200° C. in nitrogen for 10 minutes. The data summarized in Table 1 shows that conductivity of pH 5.0 PAni/Nafion® is one order magnitude, and at least two-order magnitude higher than that of pH2.0 PAni/Nafion® upon baking at 130° C., and 200° C. respectively. The comparative data demonstrates that high pH PAni/Nafion® baked at high temperature and nitrogen atmosphere has greatly enhanced conductivity than pH 2 PAni/Nafion®.

TABLE 1

Effect of pH and baking (in nitrogen) temperature on Electrical Conductivity

| Sample | Electrical conductivity (S/cm) | |
| --- | --- | --- |
|  | 130° C. | 200° C. |
| pH 2.0 PAni/Nafion ® | $1.1 \times 10^{-7}$ | $7.0 \times 10^{-7}$ |
| PH 5.0 PAni/Nafion ® | $1.1 \times 10^{-6}$ | $1.0 \times 10^{-4}$ |

Example 3

This example illustrates effect of heat treatment in air and inert atmosphere on conductivity of pH 5.11 PAni/Nafion®.

A new batch of PAni/Nafion® dispersion was synthesized according to the procedure and recipe described in Example 1. The dispersion was also resin-treated and microfluidized. Before addition of an aqueous ammonium hydroxide solution, pH of the dispersion was 1.92. The dispersion was green in color as expected for emeraldine polyaniline salt structure. A portion of pH 1.92 dispersion was added with ammonium hydroxide to increase the pH to 5.11. The dispersion was still green in color. The pH 5.11 PAni/Nafion® dispersions were spin-coated on resistance measurement substrates. Each substrate contains parallel ITO lines as electrodes. They were then baked at either at 130° C. or 200° C. in air first for 10 minutes and resistance was measured for calculation of conductivity. They were then subjected to additional baking at 200° C. for 40 minutes in nitrogen. Resistance was measured again. The conductivity data summarized in Table 2 shows that pH 5.11 PAni/Nafion®, which contains large amount ammonium cation as illustrated in Example 2, has increased in conductivity in either nitrogen or air. The higher the baking temperature is, the higher the increase is.

TABLE 2

Effect of baking in nitrogen and air on conductivity
of pH 5.11 ammonium containing PAni/Nafion ®

| Baking Conditions | Electrical conductivity (S/cm) |
|---|---|
| A) First baking: 130° C. for 10 minutes in air | $3.61 \times 10^{-5}$ |
| Second baking: Above plus 200° C. for 40 minutes in nitrogen | $1.49 \times 10^{-4}$ |
| B) First baking: 200° C. for 10 minutes in air | $1.39 \times 10^{-3}$ |
| Second baking: Above plus 200° C. for 40 minutes in nitrogen | $1.55 \times 10^{-3}$ |

Example 4

This example illustrates device performance of the pH 5.0 PAni/Nafion® made in Example 1.

The pH 5.0 PAni/Nafion® made in Example 1 was fabricated into light emitting devices using Lumination Green 1303 as shown below. The PAni/Nafion® was spin-coated on a 6"×6" glass plate at 2,800 RPM for 8 seconds resulting in a 75 nm thick film. The plate had an ITO thickness of 100 nm to 150 nm and consisted of 16 backlight substrates. Each substrate consisted of 3 pieces of 5 mm×5 mm pixel and 1 piece of 2 mm×2 mm pixel for light emission. The spin-coated films as a buffer layer were then baked on a hot plate in air at 200° C. for 10 minutes. For the light-emitting layer, a 1% (w/v) p-xylene solution of a green polyfluorene light-emitting polymer was spin-coated on top of the buffer layer films and subsequently baked at 130° C. for 10 minutes on a hot plate in an inert atmosphere dry box. The thickness of the baked films was 75 nm. A cathode consisting of 3 nm of Ba and 260 nm of Al was thermally evaporated at pressure less then $4 \times 10^{-6}$ Torr. Encapsulation of the devices was achieved by bonding a glass slide on the back of the devices using an UV-curable epoxy resin. Table 1 summarizes light emitting device efficiency 200, 500, 1,000 and 2,000 nits (Cd/m$^2$) and luminance half-life (T50) at 4,800 nits initial luminance. The data shows that pH 5.0 PAni/Nafion® layer has high efficiency and lifetime. This device performance is attributed to high temperature baking, which has led to enhancement of electrical conductivity.

TABLE 3

Lumination ® Green 1303 Device performance
using pH 5.0 PAni/Nafion ®

| Baking Temperature | Efficiency(Cd/A) | | | | T-50 (hr) |
|---|---|---|---|---|---|
| | @200 nits | @500 nits | @1,000 nits | @2,000 nits | @ RT & 30 mA/cm$^2$ |
| 200° C. | 17.2 ± 0.2 | 17.4 ± 0.2 | 17.4 ± 0.2 | 17.1 ± 0.2 | 591 |

Example 5

This example illustrates synthesis of PAni/Nafion®, a poly(tetrafluoroethylene)/perfluoroethersulfonic acid, various cation compositions, and effect of baking on electrical conductivity.

In this example, n-propanol was not added to the polymerization. Nafion® dispersion used in this example was prepared in the same manner as described in Example 1.

In a 500 mL reaction kettle were put 96.4 g of 12% solid content aqueous Nafion® dispersion (11.57 mmol SO$_3$H groups), 103 g water. The diluted Nafion® was stirred at 300 RPM using an overhead stirrer fitted with a double stage propeller blade. To the diluted Nafion® dispersion, 1.21 g (5.09 mmol) sodium persulfate (Na$_2$S$_2$O$_8$) dissolved in 15 mL water, and 422 µL (4.63 mmol) aniline dissolved in 266 µL (9.28 mmol) HCl and 20 mL water were added rapidly. The polymerization liquid turned opaque and very viscous, but there was no visible color change in 5 minutes. ~20 mg of ferric sulfate were added, but there was no visible change. However, the polymerization liquid started to turn bluish after 30 minutes and changed to green color thereafter. After about 8 hrs, 25 g of each Dowex™ M31, and Dowex™ M43 ion exchange resins, and 100 g deionized water were added to the polymerization mixture. The mixture was stirred overnight and then filtered with a filter paper. The filtrate was added with 100 g deionized water to reduce the viscosity. The filtrates were divided into five equal portions.

The first portion was kept as-is without addition of a base. This portion was determined to have pH of 2, and contain 2.88% (w/w) PAni/Nafion®. Ion chromatography analysis shows that the dispersion contains $15.9 \times 10^{-6}$ g NH$_4^+$, and $24.1 \times 10^{-6}$ g Na+ per one gram of the dispersion. Total ion concentration of the two cations is approximately equivalent to less than $0.69 \times 10^{-4}$ mole of NH$_4^+$ and Na$^+$ per one gram of PAni/Nafion®.

The second portion of pH 2 PAni/Nafion® was added with 0.1M ammonium solution to pH 5.0. This portion of NH$_4^+$ containing dispersion was determined to contain 2.88% (w/w) PAni/Nafion®. Ion chromatography analysis shows that the dispersion contains $372 \times 10^{-6}$ g NH$_4^+$ per one gram of the dispersion. The NH$_4^+$ ion concentration is approximately equivalent to $6.8 \times 10^{-4}$ mole of NH$_4^+$ per one gram of PAni/Nafion®.

The third portion of pH 2 PAni/Nafion® was added with 0.1M NaOH water solution to pH 5.0. This portion of Na$^+$ containing dispersion was determined to contain 2.89% (w/w) PAni/Nafion®. Ion chromatography analysis shows that the dispersion contains $476.7 \times 10^{-6}$ g Na$^+$ per one gram of the dispersion. The Na$^+$ ion concentration is approximately equivalent to $7.2 \times 10^{-4}$ mole of Na$^+$ per one gram of PAni/Nafion®.

The fourth portion of pH 2 PAni/Nafion® was added with 0.1M KOH water solution to pH 5.0. This portion of K$^+$ containing dispersion was determined to contain 2.72% (w/w) PAni/Nafion®. Ion chromatography analysis shows that the dispersion contains $839 \times 10^{-6}$ g K$^+$ per one gram of the dispersion. The K$^+$ ion concentration is approximately equivalent to $7.9 \times 10^{-4}$ mole of K$^+$ per one gram of PAni/Nafion®.

The fifth portion of pH 2 PAni/Nafion® was added with 0.1M Cs (cesium) OH water solution to pH 5.0. This portion of Cs$^+$ containing dispersion was determined to contain 2.91% (w/w) PAni/Nafion®. Cs$^+$ ion concentration was not determined, but it should be approximately in the range of $\sim 7 \times 10^{-4}$ mole of K$^+$ per one gram of PAni/Nafion®.

The conductivity data shows that PAni/Nafion® adjusted to high pH with NH$^+$, Na$^+$, K$^+$, and Cs$^+$ shows enhanced conductivity upon baking at high temperature.

TABLE 4

Effect of pH and baking (in nitrogen) temperature on Electrical Conductivity

| | Electrical conductivity (S/cm) | |
|---|---|---|
| Dispersion cation | 130° C. for 10 minutes in air | 200° C. for 10 minutes in argon |
| $H^+$ | $1.2 \times 10^{-8}$ | $1.6 \times 10^{-7}$ |
| $NH_4^+$ | $1.5 \times 10^{-8}$ | $1.2 \times 10^{-7}$ |
| $Na^+$ | $3.8 \times 10^{-8}$ | $2.3 \times 10^{-7}$ |
| $K^+$ | $3.8 \times 10^{-8}$ | $1.1 \times 10^{-5}$ |
| $Cs^+$ | $3.4 \times 10^{-8}$ | $1.0 \times 10^{-5}$ |

Note that not all of the activities described above in the general description or the examples are required, that a portion of a specific activity may not be required, and that one or more further activities may be performed in addition to those described. Still further, the order in which activities are listed is not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An electrically conductive film made from an aqueous dispersion comprising polyaniline, at least one fluorinated polymeric acid selected from the group consisting of perfluorosulfonic acids and perfluoroalkylenesulfonimides, and a cation solution composition, wherein the film is heat treated with at least a first baking at a temperature of at least 130° C. and a second baking treatment in a nitrogen at a temperature of at least 200° C.

* * * * *